(12) United States Patent
Wang et al.

(10) Patent No.: US 12,052,883 B2
(45) Date of Patent: Jul. 30, 2024

(54) DISPLAY SUBSTRATE AND MANUFACTURING METHOD THEREOF, DISPLAY PANEL AND DISPLAY APPARATUS

(71) Applicant: BOE Technology Group Co., Ltd., Beijing (CN)

(72) Inventors: Pinfan Wang, Beijing (CN); Pohsien Wu, Beijing (CN); Mingche Hsieh, Beijing (CN); Changyen Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 744 days.

(21) Appl. No.: 17/256,091

(22) PCT Filed: May 29, 2020

(86) PCT No.: PCT/CN2020/093250
§ 371 (c)(1),
(2) Date: Dec. 24, 2020

(87) PCT Pub. No.: WO2020/239071
PCT Pub. Date: Dec. 3, 2020

(65) Prior Publication Data
US 2021/0273197 A1     Sep. 2, 2021

(30) Foreign Application Priority Data
May 30, 2019 (CN) ......................... 201910462128.2

(51) Int. Cl.
*H10K 50/822* (2023.01)
*H10K 50/82* (2023.01)
(Continued)

(52) U.S. Cl.
CPC .......... *H10K 50/822* (2023.02); *H10K 50/82* (2023.02); *H10K 50/826* (2023.02);
(Continued)

(58) Field of Classification Search
CPC .... H10K 50/822; H10K 59/122; H10K 71/10; H10K 77/111; H10K 2102/311
(Continued)

(56) References Cited

U.S. PATENT DOCUMENTS

| 2009/0001360 A1* | 1/2009 | Nakayama | H10K 59/1213 257/43 |
| 2009/0135109 A1* | 5/2009 | Ohmi | H10K 50/171 313/504 |

(Continued)

FOREIGN PATENT DOCUMENTS

| CN | 109065599 A | 12/2018 |
| CN | 109742114 A | 5/2019 |
| CN | 110212111 A | 9/2019 |

OTHER PUBLICATIONS

First Office Action dated Dec. 23, 2020 corresponding to Chinese application No. 201910462128.2.

*Primary Examiner* — Igwe U Anya
(74) *Attorney, Agent, or Firm* — Nath, Goldberg & Meyer; Joshua B. Goldberg (57) ABSTRACT

A display substrate and a manufacturing method thereof, a display panel and a display apparatus are provided. The display substrate includes a display area, and the display substrate further includes: a base substrate; and a plurality of sub-pixels on the base substrate and in the display area. Each of the plurality of sub-pixels includes a light emitting element, and the light emitting element includes a first electrode, a light emitting layer, and a second electrode which are sequentially provided on the base substrate. A region between the plurality of sub-pixels has an opening, and the second electrode does not extend into the opening.

17 Claims, 3 Drawing Sheets

(51) Int. Cl.
*H10K 50/826* (2023.01)
*H10K 50/844* (2023.01)
*H10K 59/12* (2023.01)
*H10K 59/122* (2023.01)
*H10K 59/124* (2023.01)
*H10K 71/00* (2023.01)
*H10K 77/10* (2023.01)
*H10K 102/00* (2023.01)

(52) U.S. Cl.
CPC ......... *H10K 50/844* (2023.02); *H10K 59/122* (2023.02); *H10K 59/124* (2023.02); *H10K 71/00* (2023.02); *H10K 77/111* (2023.02); *H10K 59/1201* (2023.02); *H10K 2102/311* (2023.02); *H10K 2102/351* (2023.02)

(58) Field of Classification Search
USPC .......................................................... 257/72
See application file for complete search history.

(56) References Cited

U.S. PATENT DOCUMENTS

| | | | |
|---|---|---|---|
| 2012/0228596 A1* | 9/2012 | Fujita | H10K 50/805 |
| | | | 438/46 |
| 2015/0097171 A1* | 4/2015 | Kim | H10K 50/824 |
| | | | 438/23 |
| 2016/0049603 A1* | 2/2016 | Kleemann | H10K 10/84 |
| | | | 257/40 |
| 2016/0118451 A1* | 4/2016 | Youn | H10K 59/124 |
| | | | 257/66 |
| 2016/0190389 A1* | 6/2016 | Lee | A61B 5/0075 |
| | | | 438/28 |
| 2017/0117506 A1* | 4/2017 | Hiraoka | H05B 44/00 |
| 2017/0249886 A1 | 8/2017 | Choi | |
| 2017/0278920 A1 | 9/2017 | Park et al. | |
| 2017/0279057 A1 | 9/2017 | Park et al. | |
| 2018/0301521 A1* | 10/2018 | Yang | H10K 59/35 |
| 2019/0140202 A1* | 5/2019 | Jin | H10K 59/131 |

* cited by examiner

DISPLAY SUBSTRATE AND MANUFACTURING METHOD THEREOF, DISPLAY PANEL AND DISPLAY APPARATUS

CROSS-REFERENCE TO RELATED APPLICATIONS

This is a National Phase Application filed under 35 U.S.C. 371 as a national stage of PCT/CN2020/093250, filed on May 29, 2020, an application claiming the priority of the Chinese Patent Application No. 201910462128.2, filed on May 30, 2019 in the Chinese Intellectual Property Office, the content of each which is incorporated herein by reference in its entirety.

TECHNICAL FIELD

The present disclosure relates to the field of display technology, and in particular, to a display substrate and a manufacturing method thereof, a display panel and a display apparatus.

BACKGROUND

With continuous development of a flexible display panel, a stretchable flexible display panel is becoming more and more popular to a user using a portable apparatus due to stretchability, portability and wide application of the stretchable flexible display panel.

At present, a top-emitting structure is generally employed in a display element (e.g., a light emitting element) in the stretchable flexible display panel, i.e., light penetrates through a cathode of the light emitting element and is emitted from a side of the cathode distal to a base substrate, the cathode is a transparent electrode with a small thickness and needs to be patterned.

SUMMARY

A display substrate and a manufacturing method thereof, a display panel and a display apparatus are provided according to an embodiment of the present disclosure.

In a first aspect of the present disclosure, a display substrate is provided. The display substrate includes a display area, the display substrate further including: a base substrate; and a plurality of sub-pixels on the base substrate and in the display area, each of the plurality of sub-pixels including a light emitting element, and the light emitting element includes a first electrode, a light emitting layer, and a second electrode which are sequentially provided on the base substrate; wherein a region between the plurality of sub-pixels has an opening, and the second electrode does not extend into the opening.

In an embodiment, the plurality of sub-pixels are arranged in an array, at least one adjacent sub-pixel in the plurality of sub-pixels forms a display group, the opening is in a region between two adjacent display groups, and no opening is in each of display groups.

In an embodiment, the display substrate further includes: a thin film transistor, a planarization layer, and a pixel defining layer, wherein the thin film transistor is on the base substrate; the planarization layer is between a layer where the thin film transistor is located and a layer where the light emitting element is located, the layer where the light emitting element is located is on a side of the planarization layer distal to the base substrate, and a connection via is in the planarization layer at a position corresponding to the thin film transistor; the first electrode of the light emitting elements is electrically coupled to a drain of the thin film transistor through the connection via; the pixel defining layer is at two ends of the first electrode, on a side of the first electrode distal to the base substrate, and has a hole exposing a center portion of the first electrode; the light emitting layer of the light emitting element is on a side of the first electrode distal to the base substrate, and the second electrode of the light emitting element is on an exposed portion of the light emitting layer and an exposed portion of the pixel defining layer and serves as a reflective electrode; and the opening penetrates through all the layers on the base substrate and the base substrate.

In an embodiment, a material of the second electrode includes one or more of aluminum, lithium, cesium, barium, and silver.

In an embodiment, the second electrode has a thickness greater than 10,000 angstroms.

In an embodiment, the second electrode has a reflectivity greater than 90%.

In an embodiment, the display substrate further includes an etching protection layer on a side of the second electrode distal to the base substrate and exposing the opening.

In an embodiment, the etching protection layer has a thickness greater than 5,000 angstroms.

In an embodiment, a material of the etching protection layer includes at least one of silicon nitride, silicon oxide, indium tin oxide, and indium zinc oxide.

In an embodiment, the display substrate further includes an encapsulation layer on a side of the etching protection layer distal to the second electrode and exposing the opening.

In a second aspect of the present disclosure, a display panel is provided. The display panel includes the display substrate according to any one of the embodiments of the first aspect of the present disclosure, and a color film substrate or a transparent cover plate.

In a third aspect of the present disclosure, a display apparatus is provided. The display apparatus includes the display panel according to any one of the embodiments of the second aspect of the present disclosure and a driving circuit for driving the display panel.

In a fourth aspect of the present disclosure, a method for manufacturing the display substrate in the embodiments in a first aspect of the present disclosure is provided. The method includes: forming a plurality of sub-pixels on a base substrate, the plurality of sub-pixels being in a display area of the display substrate, each of the plurality of sub-pixels including a light emitting element, wherein the method for manufacturing the display substrate further includes: forming a planarization layer on a base substrate; forming an opening in the planarization layer; forming a first electrode of the light emitting element on the planarization layer at a position where the opening is not located; forming a pixel defining layer on the first electrode and at two ends of the first electrode, the pixel defining layer having a hole exposing a center portion of the first electrode, and the pixel defining layer exposing the opening; forming a light emitting layer of the light emitting element on the first electrode and in the hole of the pixel defining layer; and forming a second electrode of the light emitting element on an exposed portion of the light emitting layer and an exposed portion of the pixel defining layer, and the second electrode of the light emitting element not extending into the opening.

In an embodiment, forming the second electrode of the light emitting element includes: forming a second electrode material layer on the exposed portion of the light emitting layer and the exposed portion of the pixel defining layer; and performing a photolithography process on the second electrode material layer in a yellow room to form a pattern of a second electrode, wherein the formed second electrode serves as a reflective electrode and does not extend into the opening.

In an embodiment, the method for manufacturing the display substrate further includes: forming respective layer structures of the thin film transistor on the base substrate; forming a planarization layer on the respective layer structures of the thin film transistor, and forming a connection via in the planarization layer at a position corresponding to a drain of the thin film transistor, such that the first electrode of the light emitting element on the planarization layer is coupled to the drain through the connection via; and forming the opening extending toward the base substrate to penetrate through the base substrate in a region between the plurality of sub-pixels.

In an embodiment, forming the plurality of sub-pixels in an array, and regarding at least one adjacent sub-pixel in the plurality of sub-pixels as a display group, the method for manufacturing the display substrate further includes: forming the opening extending toward the base substrate to penetrate through the base substrate in a region between two adjacent display groups.

In an embodiment, the second electrode is made of one or more of aluminum, lithium, cesium, barium and silver, the second electrode has a thickness greater than 10,000 angstroms, and the second electrode has a reflectivity greater than 90%.

In an embodiment, the method for manufacturing the display substrate further includes forming an etching protection layer on a side of the second electrode material layer distal to the base substrate, and forming the second electrode by performing a photolithography process on the second electrode material layer in a yellow room after forming the etching protection layer, wherein the etching protection layer exposes the opening, the etching protection layer has a thickness greater than 5,000 angstroms, and the etching protection layer is made of at least one of silicon nitride, silicon oxide, indium tin oxide, and indium zinc oxide.

In an embodiment, the method for manufacturing the display substrate further includes forming an encapsulation layer on a side of the etching protection layer distal to the second electrode, wherein the encapsulation layer exposes the opening.

DETAILED DESCRIPTION

In order to make one of ordinary skill in the art better understand the technical solutions of the present disclosure, the following detailed description is given with reference to the accompanying drawings and the exemplary embodiments.

Inventors of the present disclosure have discovered that at least the following problems exist in a flexible display panel in the related art. A material of a cathode of a display element (e.g., light emitting element) is extremely sensitive to a water-oxygen environment. The cathode is generally made of a layer of silver with a relatively small thickness to enable light to penetrate there through. A special external environment is needed when a patterning process is performed on the silver material, resulting in that the patterning process cannot be implemented by a photolithography process (which is generally performed in a yellow room) and a requirement of a high resolution of the flexible display panel cannot be met.

Figure 1:
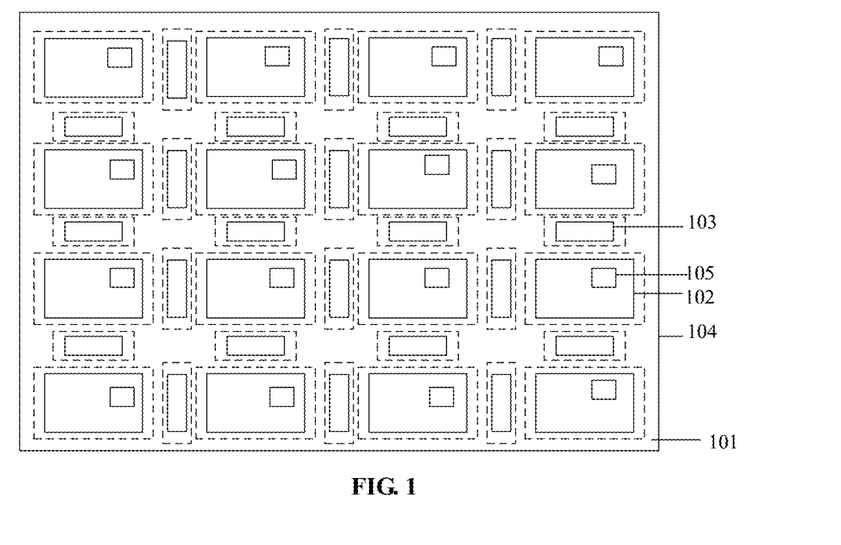
FIG. 1 is a schematic plan view illustrating a structure of a display substrate according to an embodiment of the present disclosure.
Figure 2:
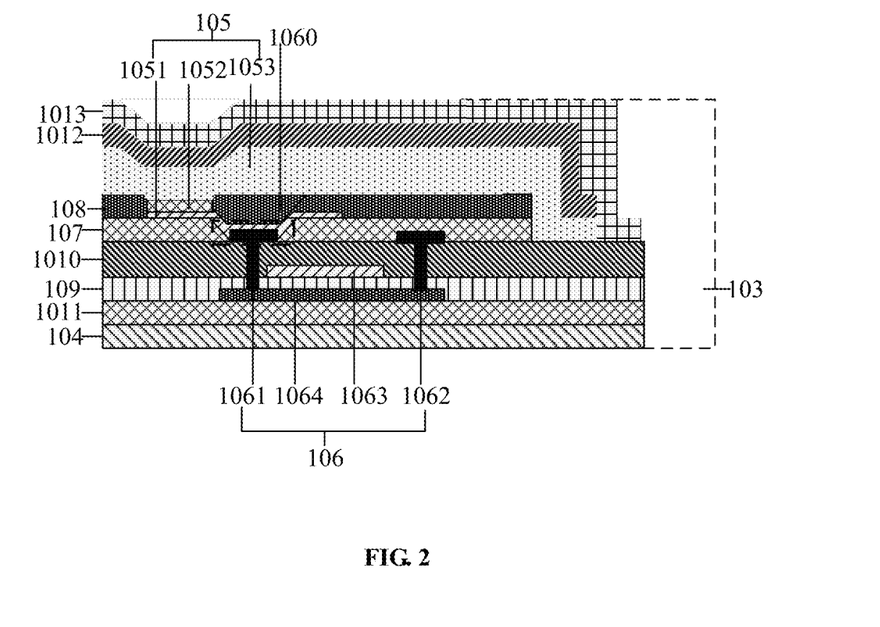
FIG. 2 is a schematic cross-sectional view illustrating a structure of a display substrate according to an embodiment of the present disclosure.

In view of at least the above, according to an aspect of the present disclosure, a display substrate is provided, and FIG. 1 is a schematic plan view illustrating a structure of a display substrate according to an embodiment of the present disclosure. As shown in FIG. 1, the display substrate includes a display area 101 and a non-display area (not shown, for example, the non-display area may be in a periphery surrounding the display area 101), and openings 103 are in at least portions of the display area 101. The display substrate includes: a base substrate 104, and a plurality of sub-pixels 102 on the base substrate 104. Each of the sub-pixels 102 has a light emitting element (which may be also referred to as light emitting device) 105 therein. Since FIG. 1 is a schematic plan view illustrating a structure of a display substrate according to an embodiment of the present disclosure, for convenience of presenting a structure of the light emitting element 105, a schematic cross-sectional view of the structure of the display substrate is also provided according to an embodiment of the present disclosure, and FIG. 2 is a schematic cross-sectional view illustrating a structure of a display substrate according to an embodiment of the present disclosure. For example, FIG. 2 shows a cross-sectional view of one sub-pixel 102 and one opening 103 in an upper left corner of FIG. 1 taken along a horizontal line passing through the light emitting element 105 in the sub-pixel 102 and the opening 103. As shown in FIG. 2, the light emitting element 105 includes a first electrode 1051, a light emitting layer 1052 and a second electrode 1053 which are sequentially provided on the base substrate 104. The second electrode 1053 is a reflective electrode, and each of second electrodes 1053 is disconnected from any of the openings 103. In other words, an orthogonal projection of each of the openings 103 on the base substrate 104 may not overlap with an orthogonal projection of each of the second electrodes 1053 on the base substrate 104.

As shown in FIG. 1, the openings 103 may be in regions between the plurality of sub-pixels in the display area 101 on the base substrate 104, and the openings 103 may penetrate through all layer structures including the base substrate 104 or may penetrate through all layer structures on the base substrate 104 except the base substrate 104. Stress generated in stretching the display substrate can be effectively reduced by providing the openings 103, such that the flexible display substrate can have good stretchability. Compared with the related art in which a second electrode covers an entire surface (in other words, the second electrodes 1053 of the light emitting elements 105 in the sub-pixels are formed integrally as a one-piece structure without an opening) of a display substrate, the second electrodes 1053 in the present disclosure are disconnected at the openings 103 and are continuous at other positions except the openings 103, which is beneficial to enhancing the stretchability of the display substrate. In addition, the base substrate 104 may be made of a flexible material that can be easily stretched, bent, curled or folded, and the material of the base substrate 104 may include ultra-thin glass, metal, plastic, or the like. For example, the material of the base substrate 104 may include polyimide (PI).

It should be noted that the first electrode 1051 of each of the light emitting element 105 in the display substrate according to an embodiment of the present disclosure may be an anode of the light emitting element 105, and the second electrode 1053 may be a cathode of the light emitting element 105. The first electrode 1051 is a transparent electrode, and the second electrode 1053 is a reflective electrode. Light emitted from the light emitting layer 1052 can be reflected from the second electrode 1053 to the first electrode 1051, and can be emitted downward (i.e., in a direction from the first electrode 1051 to the base substrate 104) through the first electrode 1051, that is, the display substrate is a display substrate of a bottom emitting type. Each of the light emitting elements 105 according to an embodiment of the present disclosure may be a light emitting element that emits red (R) light, green (G) light, blue (B) light, or white (W) light. The second electrodes 1053 are disconnected at the positions where the openings 103 are located, which facilitates to realize encapsulation of the display substrate at the positions where the openings 103 are located. It should be understood that other interlayer insulating layers, such as a buffer layer 1011, a pixel defining layer 108, and the like, may further be provided on the base substrate 104, and the other interlayer insulating layers on the base substrate 104 may be etched to form the openings 103. The specific structures of the other interlayer insulating layers will be described in detail in the following embodiments with reference to the accompanying drawings.

It should be noted that, in addition to the above-mentioned structures, each of the light emitting elements 105 may further include other functional layers in the related art, such as a hole transport layer, a hole injection layer, an electron transport layer, and an electron injection layer, detailed description of which are omitted herein.

In the display substrate according to an embodiment of the present disclosure, since the openings 103 are provided in the regions between the sub-pixels 102 in the display area 101, the stress on the display substrate caused by stretching the display substrate can be effectively reduced, resulting in good stretchability of the display substrate. In addition, in each light emitting element 105 of a bottom emitting type, light can be reflected from the second electrode 1053 to the first electrode 1051, and the second electrode 1053 may have a thickness greater than that of the second electrode in a display substrate in the related art. Since the second electrode 1053 has a thickness large enough, a photolithography process (e.g., a photolithography dry etching process) may be employed to perform a patterning process on the second electrode 1053, so as to obtain a precise pattern, thereby minimizing a region between the second electrode 1053 and a corresponding opening 103, improving a resolution of the display substrate, and improving display quality of the display substrate.

Based on the display substrate in the above embodiments, another display substrate according to other embodiments of the present disclosure will be described with reference to the accompanying drawings, and repeated description may be omitted for conciseness.

Figure 3:
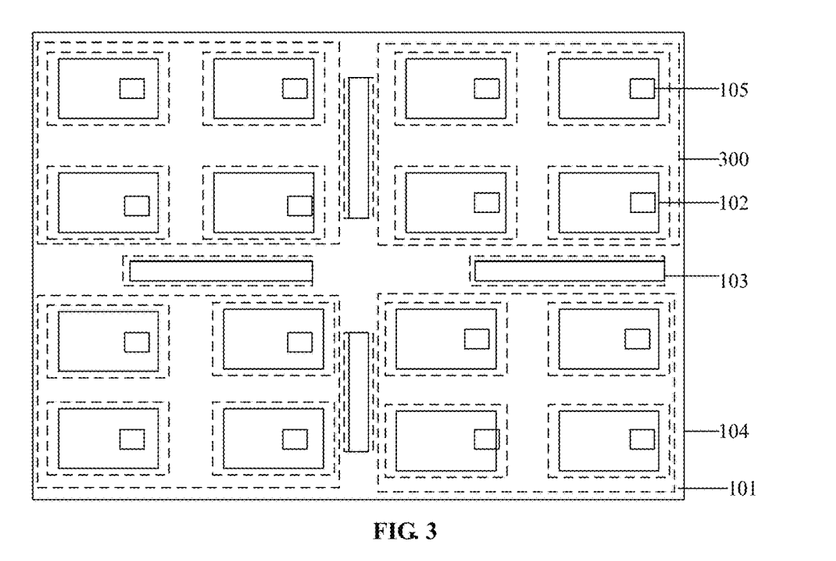
FIG. 3 is a schematic plan view illustrating a structure of a display substrate according to an embodiment of the present disclosure.

FIG. 3 is a schematic plan view illustrating a structure of another display substrate according to an embodiment of the present disclosure. As shown in FIG. 3, among all the sub-pixels 102 of the display substrate according to an embodiment of the present disclosure, multiple (for example, 2, 4, 6, 8, 9, and so on, and FIG. 3 shows an example of 4) sub-pixels 102 arranged in an array form a display group (or referred to as a "sub-pixel group") 300. The openings 103 may be formed in an interlayer insulating layer and other layers on the base substrate 104 by an etching process. The openings 103 may be provided in regions between adjacent sub-pixels 102 in each of the display groups 300, or may be provided in regions between two adjacent display groups 300 in a row direction (e.g., a horizontal direction in FIG. 3) and between two adjacent display groups 300 in a column direction (e.g., a vertical direction in FIG. 3). As shown in FIG. 3, in order to facilitate the manufacturing of the display substrate, an opening 103 may be provided in the region between two adjacent display groups (i.e., the opening 103 is provided outside each of the display groups 300), but is not provided in each of the display groups 300. The second electrode 1053 of each of the light emitting elements 105 at the position where each of the openings 103 is located is disconnected by a patterning process, such as a photolithography process. The second electrodes 1053 of the light emitting elements 105 of the sub-pixels 102 arranged in an array in each display group 300 are formed as a one-piece structure, that is, in each display group 300, the second electrodes 1053 of the light emitting elements 105 in all the sub-pixels 102 are formed integrally as a one-piece structure without an opening therein.

In the display substrate according to an embodiment of the present disclosure, the openings 103 are provided between adjacent display groups 300, such that the stress on the display substrate caused by stretching the display substrate can be effectively reduced. A same voltage may be applied to the second electrodes 1053 of the respective light emitting elements 105 in each of the display groups 300. The second electrodes 1053 of the light emitting elements 105 in each of the display group 300 are formed as a one-piece structure, and may be deposited as a one-piece layer, which is beneficial to manufacturing of the display substrate and improving the manufacturing efficiency of the display substrate.

FIG. 2 is a schematic plan view illustrating a structure of a display substrate according to an embodiment of the present disclosure, and as shown in FIG. 2, in addition to the structures provided in the embodiments of FIGS. 1 and 3, the display substrate may further include: a thin film transistor 106, a planarization layer 107, and a pixel defining layer 108.

The planarization layer 107 is provided between a layer where thin film transistors 106 are located and a layer where the light emitting elements 105 are located, and connection vias 1060 are arranged at positions in the planarization layer 107 corresponding to the thin film transistors 106 (in other words, each of the connection vias 1060 and a drain 1061 of a corresponding thin film transistors 106 may overlap with each other in a direction perpendicular to the base substrate 104). The first electrode 1051 of each light emitting element 105 is electrically coupled to the drain 1061 of the corresponding thin film transistor 106 through the connection via 1060. The pixel defining layer 108 is provided at both ends of the first electrode 1051 and on a side of the first electrode 1051 distal to the base substrate 104, and may also be provided on a side of the planarization layer 107 distal to the base substrate 104. Each of the openings 103 penetrates through the planarization layer 107 and the pixel defining layer 108.

It should be noted that each thin film transistor 106 includes a drain 1061, a source 1062, a gate 1063, and an active layer 1064. The respective layers of the thin film transistor 106 may be manufactured in a hierarchical order in the related art, so as to obtain a thin film transistor of a top gate type (as shown in FIG. 2) or a thin film transistor of a bottom gate type, which is not limited herein. A first insulating layer 109 is further provided between the active layer 1064 and the gate 1063 of each thin film transistor 106, and a second insulating layer 1010 is further provided between the gate 1063 and both the drain 1061 and the source 1062 of the thin film transistor 106. The first insulating layer 109 is provided on the active layer 1064 to insulate the active layer 1064 from the gate electrode 1063. The second insulating layer 1010 is provided on the gate 1063 and the first insulating layer 109 to insulate the source 1062 and the drain 1061 from the gate 1063. A material of the first insulating layer 109 and the second insulating layer 1010 may include an organic material or an inorganic material. Each of the first insulating layer 109 and the second insulating layer 1010 may have a single-layer structure or a multi-layer structure, which is not limited herein.

The planarization layer 107 is provided between the layer where the thin film transistors 106 are located and the layer where the light emitting elements 105 are located, and the planarization layer 107 may cover the thin film transistors 106 to planarize unevenness caused by the electrodes of the thin film transistors 106, thereby preventing the light emitting elements 105 from being damaged due to the unevenness. Further, each connection via 1060 is provided in the planarization layer 107 at a position corresponding to a corresponding thin film transistor 106, and the first electrode 1051 of the light emitting element 105 is coupled to the drain 1061 of the thin film transistor 106 through the connection via 1060. Whether the light emitting element 105 emits light or not can be controlled by controlling the thin film transistor 106 to be turned-on or turned off, thereby implementing a display function of the display substrate.

The pixel defining layer 108 may be formed on the first electrode 1051, cover two ends of the first electrode 1051, and have a hole to expose a center portion of the first electrode 1051. The light emitting layer 1052 is formed on the first electrode 1051 exposed in the hole. The pixel defining layer 108 may define pixel units formed on the display substrate, and avoid poor display effect caused by cross color between adjacent pixel units. The above-mentioned planarization layer 107 and the pixel defining layer 108 are disconnected at the positions where the openings 103 are located, i.e., the openings 103 penetrates through the planarization layer 107 and the pixel defining layer 108. In other words, an orthogonal projection of each of the openings 103 on the base substrate 104 does not overlap with an orthogonal projection of each of the planarization layer 107 and the pixel defining layer 108 on the base substrate 104.

It should be noted that the interlayer insulating layer of the display substrate according to an embodiment of the present disclosure may further include a buffer layer 1011, an etching protection layer 1012, and an encapsulation layer 1013. Each of the openings 103 may penetrate through all layers on the base substrate 104 (including the buffer layer 1011, the etching protection layer 1012, and the encapsulation layer 1013), and may further penetrate through the base substrate 104. The buffer layer 1011 covers the base substrate 104 (i.e., between the base substrate 104 and the active layer 1064) and may be made of an organic material, an inorganic material, or a stack of multiple layers of an organic material or an inorganic material. The etching protection layer 1012 covers the second electrode 1053, so as to prevent a pattern of the second electrode 1053 from being damaged during etching, and to ensure forming an accurate pattern of the second electrode 1053. The encapsulation layer 1013 may encapsulate the light emitting elements 105, the thin film transistors 106, and other layers, so as to prevent moisture, oxygen, and the like from permeating into the organic layer(s) of the display substrate and causing damage to the display substrate. It should be understood that, since the second electrodes 1053 are disconnected at the positions where the openings 103 are located, the openings 103 may be formed in the layers, such as the etching protection layer 1012 and the encapsulation layer 1013, and the like, on the second electrode 1053 by an etching process. The etching protection layer 1012 may be formed on the second electrodes 1053 of the light emitting elements 105 by vapor deposition or physical vapor deposition, after the light emitting elements 105 are completed by evaporation. Since each of the light emitting elements 105 according to an embodiment of the present disclosure is a light emitting element of a bottom emitting type having the second electrode 1053 of a great thickness, a photolithography process (which is generally performed in a yellow room) may be employed to perform a patterning process on the second electrode 1053, so as to obtain a precise pattern of the second electrode 1053, thereby improving the resolution of the display substrate, and improving the display quality of the display substrate.

In an embodiment, a material of each of the second electrodes 1053 includes: one or more of aluminum, lithium, cesium, barium, and silver. Each of the second electrodes has a thickness greater than 10,000 angstroms and a reflectivity greater than 90%. Thus, the light emitting efficiency of the display substrate can be enhanced, and a good display quality thereof can be ensured.

It is to be noted that each of the second electrodes 1053 may be made of one material or a mixture of a plurality of materials. Since each of the light emitting elements 105 is a light emitting element of a bottom emitting type, it is not necessary to consider reducing the thickness of the second electrode 1053 in order to achieve good light transmission of the second electrode 1053. Therefore, the thickness of the second electrode 1053 may be greater than 10,000 angstroms, and any thickness that satisfies this requirement may be adopted.

In an embodiment, the etching protection layer 1012 has a thickness greater than 5,000 angstroms, which ensures that the second electrode 1053 is not damaged during the etching process. The etching protection layer may be made of at least one of silicon nitride, silicon oxide, indium tin oxide, and indium zinc oxide.

Figure 4:
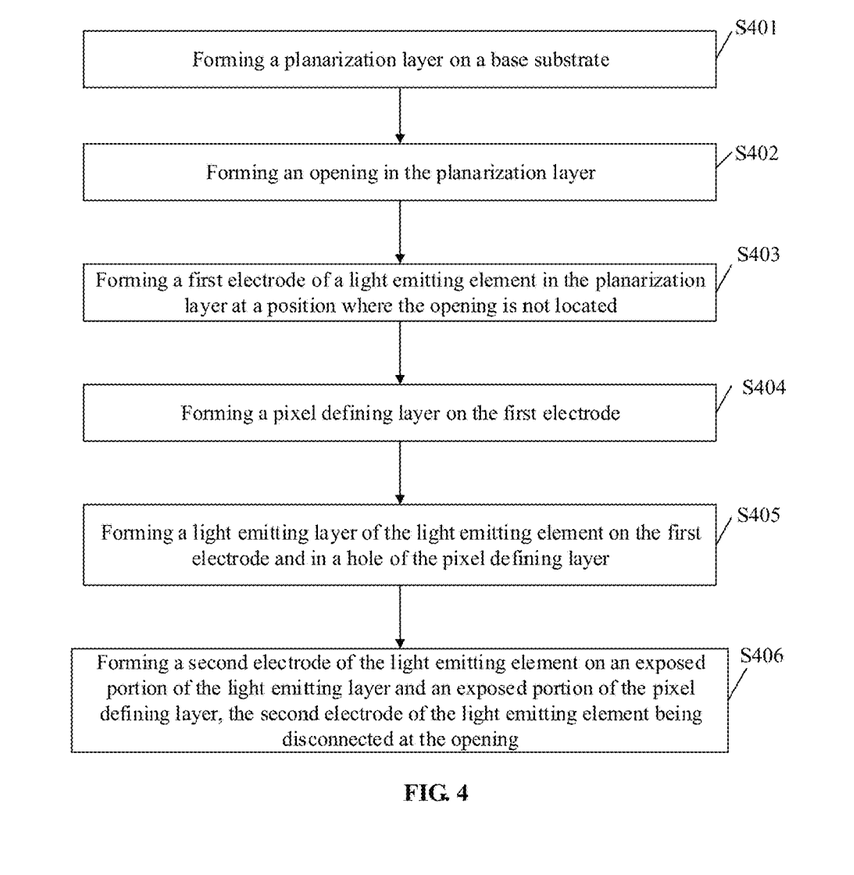
FIG. 4 is a flowchart of a method for manufacturing a display substrate according to an embodiment of the present disclosure.

Based on the same concept as the foregoing, a method for manufacturing a display substrate is provided according to an embodiment of the present disclosure, and the method may be for manufacturing the display substrate provided in any one of the above embodiments. FIG. 4 is a flowchart of a method for manufacturing a display substrate according to an embodiment of the present disclosure. The method for manufacturing the display substrate includes forming a plurality of sub-pixels on a base substrate. The plurality of sub-pixels are located in a display area of the display substrate, and each of the plurality of sub-pixels includes a light emitting element. As shown in FIG. 4, the method for manufacturing the display substrate may include the following steps S401 to S406.

In step S401, a planarization layer is formed on the base substrate.

In step S402, openings are formed in the planarization layer. The openings are located in regions between the sub-pixels to be formed.

In step S403, first electrodes of the light emitting elements are formed on the planarization layer at the positions where the openings are not located.

In step S404, a pixel defining layer is formed on each first electrode and at two ends of the first electrode. The pixel defining layer has a hole exposing a center portion of the first electrode and exposes each of the openings.

In step S405, light emitting layers of the light emitting elements are formed in the holes of the pixel defining layer on the first electrodes, respectively.

In step S406, second electrodes of the light emitting elements are formed on an exposed portion of the light emitting layers and an exposed portion of the pixel defining layer, and the second electrodes of the light emitting elements are disconnected at the positions where the opening are located. In other words, each of the second electrodes 1053 does not extend into any of the openings 103.

As described above, each of the plurality of light emitting elements formed on the base substrate includes: the first electrode, the light emitting layer and the second electrode which are sequentially formed on the base substrate. The second electrode is a reflective electrode, and the second electrode of each of the light emitting elements is disconnected at a position where each of the openings is located. In other words, the second electrode 1053 of each of the light emitting elements 105 does not extend into any of the openings 103.

In the method for manufacturing the display substrate according to an embodiment of the present disclosure, since the openings are provided in the display area, the stress on the display substrate caused by stretching the display substrate can be effectively reduced, resulting in good stretchability of the display substrate. In addition, by adopting the light emitting element of a bottom emitting type, light can be reflected from the second electrode to the first electrode, and the second electrode may have a thickness greater than that of the second electrode in the display substrate in the related art. Since the second electrode has a thickness great enough, a photolithography process (which is generally performed in a yellow room) may be employed to perform a patterning process on the second electrode, so as to obtain a precise pattern thereof, thereby minimizing the region between each second electrode and an adjacent (or corresponding) opening, thereby improving the resolution of the display substrate, and improving the display quality of the display substrate.

Optionally, an embodiment of the present disclosure provides a method for forming a second electrode of each of the light emitting elements. The method for forming the second electrode of each of the light emitting element includes the following steps. Firstly, a second electrode material layer is formed on an exposed portion of the light emitting layers and an exposed portion of the pixel defining layer. Then, a pattern of the second electrode is formed by performing a photolithography process (which is generally performed in a yellow room) on the second electrode material layer, and the formed second electrode is disconnected at the position where each of the openings is located. A material for forming the second electrode material layer includes one or more of aluminum, lithium, cesium, barium, and silver. The formed second electrode has a thickness greater than 10,000 angstroms and a reflectivity greater than 90%. Thus, the light emitting efficiency of the display substrate can be improved, and a good display quality thereof can be ensured.

It should be noted that, since the light emitting element manufactured by the method according to an embodiment of the present disclosure is of a bottom emitting type, it may not be necessary to consider reducing the thickness of the second electrode in order to achieve good light transmission of the second electrode (i.e., the cathode), and therefore, the thickness of the second electrode is thicker than that of a second electrode of a light emitting element of a top emitting type in the related art. Since the second electrode has a thickness large enough, a photolithography process (which is generally performed in a yellow room) may be employed to perform a patterning process on the second electrode and the resulted second electrode is disconnected at the position where each of the openings is located, so as to obtain a precise pattern of the resulted second electrode, thereby minimizing the region between the second electrode and a corresponding opening, improving the resolution of the display substrate, and improving the display quality of the display substrate.

Figure 5:
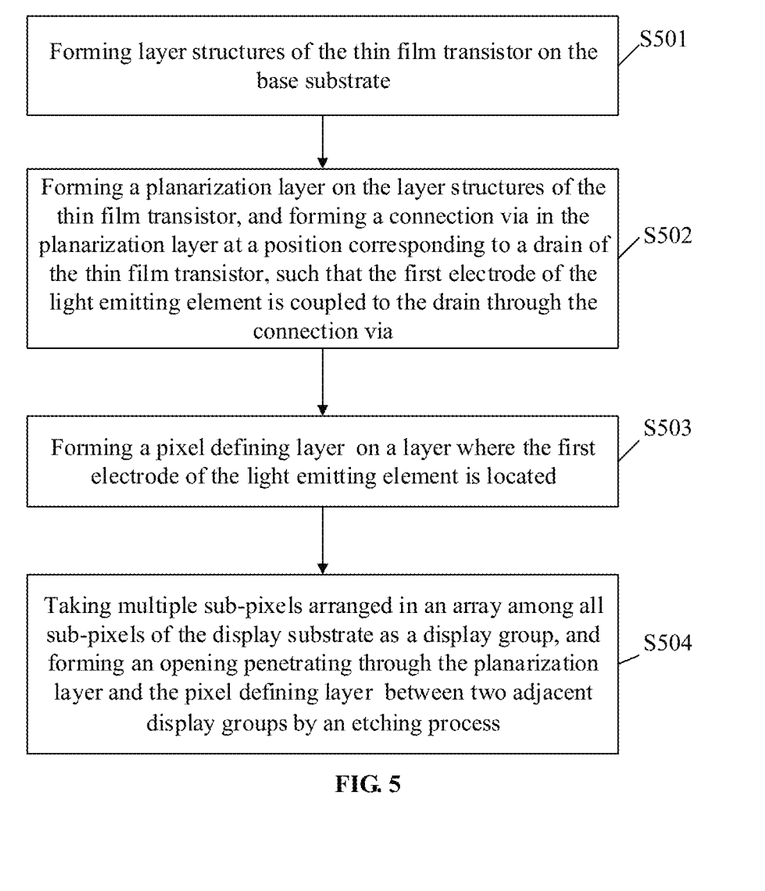
FIG. 5 is a flowchart of a method for manufacturing a display substrate according to an embodiment of the present disclosure.

Optionally, another method for manufacturing a display substrate is provided according to an embodiment of the present disclosure. Interlayer insulating layers in the display substrate manufactured by the method provided in the embodiment of the present disclosure may include: a planarization layer and a pixel defining layer. FIG. 5 is a flowchart of another method for manufacturing a display substrate according to an embodiment of the present disclosure. As shown in FIG. 5, the method may include the following steps S501 to S504.

In step S501, respective layer structures of a thin film transistor are formed on the base substrate.

In step S502, a planarization layer is formed on the respective layer structures of the thin film transistor, and a connection via is formed (e.g., etched) in a position in the planarization layer corresponding to a drain of the thin film transistor, such that the first electrode of each light emitting element is coupled to the drain through the connection via.

In step S503, a pixel defining layer is formed on a layer where the first electrode of the light emitting element is located.

Step S504, a plurality of sub-pixels arranged in an array in all sub-pixels of the display substrate are taken as a display group, and an opening penetrating through the planarization layer and the pixel defining layer is formed by an etching process between two adjacent display groups. The opening may extend all the way to penetrate through the base substrate.

In the method for manufacturing the display substrate according to an embodiment of the present disclosure, since all the sub-pixels are arranged in an array and the divided display groups are also arranged in an array, the positions of the openings penetrating through the planarization layer and the pixel limiting layer between adjacent display groups formed by an etching process are regularly arranged. In addition, the second electrodes of the light emitting elements in each display group may be deposited integrally as a one-piece layer, such that the manufacturing of the display substrate is easy, and the manufacturing efficiency of the display substrate is improved.

In an embodiment, the method for manufacturing the display substrate further includes forming an etching protection layer on a side of the second electrode material layer distal to the base substrate, and forming a second electrode by performing a photolithography process (which is generally performed in a yellow room) on the second electrode material layer after the etching protection layer is formed. The etching protection layer exposes the openings. A thickness of the etching protection layer is greater than 5,000 angstroms. The etching protection layer may be made of at least one material of silicon nitride, silicon oxide, indium tin oxide, and indium zinc oxide.

In an embodiment, the method for manufacturing the display substrate further includes forming an encapsulation layer on a side of the etching protection layer distal to the second electrodes, and the encapsulation layer exposes the openings.

Based on the same concept as the foregoing, a display panel is provided according to an embodiment of the present disclosure. The display panel includes the display substrate provided in any one of the above embodiments, and may further include other display structures in the related art, such as a color filter substrate or a transparent cover plate (e.g., a glass cover plate). The implementation principle of the display panel provided by the embodiment of the present disclosure is similar to that of the display substrate provided by any one of the foregoing embodiments, and is not described herein again.

Based on the same concept as the foregoing, a display apparatus is provided according to an embodiment of the present disclosure. The display apparatus includes the display panel provided in any one of the above embodiments and a driving circuit for driving the display panel. The driving circuit may be a conventional driving circuit for driving the respective sub-pixels to display. The display apparatus may be a mobile phone, a computer, an intelligent wearable apparatus, or the like, and the implementation principle of the display apparatus is similar to that of the display substrate provided in any one of the above embodiments, detailed description of which is omitted here.

It should be understood that the above embodiments are merely exemplary embodiments employed to illustrate the principles of the present disclosure, and the present disclosure is not limited thereto. It will be apparent to one of ordinary skill in the art that various changes and modifications can be made therein without departing from the scope of the present disclosure as defined by the appended claims, and these changes and modifications also fall within the scope of the present disclosure.

What is claimed is:

1. A display substrate, comprising a display area,
the display substrate further comprising: a base substrate; and a plurality of sub-pixels on the base substrate and in the display area, each of the plurality of sub-pixels comprising a light emitting element, and the light emitting element comprises a first electrode, a light emitting layer, and a second electrode which are sequentially provided on the base substrate;
wherein a region between the plurality of sub-pixels has an opening, and the second electrode does not extend into the opening;
wherein the plurality of sub-pixels are arranged in an array, and a region between any adjacent two of the plurality of sub-pixels has the opening; and
wherein the opening extends along a first side, which is proximal to the opening, of any one sub-pixel adjacent to the opening, and the opening does not extend beyond the first side.

2. The display substrate of claim 1, further comprising: a thin film transistor, a planarization layer, and a pixel defining layer, wherein
the thin film transistor is on the base substrate;
the planarization layer is between a layer where the thin film transistor is located and a layer where the light emitting element is located, the layer where the light emitting element is located is on a side of the planarization layer distal to the base substrate, and a connection via is in the planarization layer at a position corresponding to the thin film transistor;
the first electrode of the light emitting elements is electrically coupled to a drain of the thin film transistor through the connection via;
the pixel defining layer is at two ends of the first electrode, on a side of the first electrode distal to the base substrate, and has a hole exposing a center portion of the first electrode;
the light emitting layer of the light emitting element is on a side of the first electrode distal to the base substrate, and the second electrode of the light emitting element is on an exposed portion of the light emitting layer and an exposed portion of the pixel defining layer and serves as a reflective electrode; and
the opening penetrates through all the layers on the base substrate and the base substrate.

3. The display substrate of claim 2, wherein a material of the second electrode comprises one or more of aluminum, lithium, cesium, barium, and silver.

4. The display substrate of claim 3, wherein the second electrode has a thickness greater than 10,000 angstroms.

5. The display substrate of claim 4, wherein the second electrode has a reflectivity greater than 90%.

6. The display substrate of claim 1, further comprising an etching protection layer on a side of the second electrode distal to the base substrate and exposing the opening.

7. The display substrate of claim 6, wherein the etching protection layer has a thickness greater than 5,000 angstroms.

8. The display substrate of claim 7, wherein a material of the etching protection layer comprises at least one of silicon nitride, silicon oxide, indium tin oxide, and indium zinc oxide.

9. The display substrate of claim 6, further comprising an encapsulation layer on a side of the etching protection layer distal to the second electrode and exposing the opening.

10. A display panel, comprising the display substrate of claim 1; and
a color film substrate or a transparent cover plate.

11. A display apparatus, comprising the display panel of claim 10 and a driving circuit for driving the display panel.

12. A method for manufacturing a display substrate, the display substrate being the display substrate of claim 1, the method comprising: forming the plurality of sub-pixels on the base substrate, the plurality of sub-pixels being in the display area of the display substrate, each of the plurality of sub-pixels comprising the light emitting element, wherein the method for manufacturing the display substrate further comprises:
forming a planarization layer on the base substrate;
forming the opening in the planarization layer;
forming the first electrode of the light emitting element on the planarization layer at a position where the opening is not located;
forming a pixel defining layer on the first electrode and at two ends of the first electrode, the pixel defining layer having a hole exposing a center portion of the first electrode, and the pixel defining layer exposing the opening;

forming the light emitting layer of the light emitting element on the first electrode and in the hole of the pixel defining layer; and forming the second electrode of the light emitting element on an exposed portion of the light emitting layer and an exposed portion of the pixel defining layer, and the second electrode of the light emitting element not extending into the opening.

13. The method for manufacturing the display substrate of claim 12, wherein forming the second electrode of the light emitting element comprises:

forming a second electrode material layer on the exposed portion of the light emitting layer and the exposed portion of the pixel defining layer; and performing a photolithography process on the second electrode material layer in a yellow room to form a pattern of the second electrode, wherein the formed second electrode serves as a reflective electrode and does not extend into the opening.

14. The method for manufacturing the display substrate of claim 13, further comprising:

forming respective layer structures of the thin film transistor on the base substrate;

forming a planarization layer on the respective layer structures of the thin film transistor, and forming a connection via in the planarization layer at a position corresponding to a drain of the thin film transistor, such that the first electrode of the light emitting element on the planarization layer is coupled to the drain through the connection via; and forming the opening extending toward the base substrate to penetrate through the base substrate in a region between the plurality of sub-pixels.

15. The method for manufacturing the display substrate of claim 12, wherein the second electrode is made of one or more of aluminum, lithium, cesium, barium and silver, the second electrode has a thickness greater than 10,000 angstroms, and the second electrode has a reflectivity greater than 90%.

16. The method for manufacturing the display substrate of claim 15, further comprising forming an etching protection layer on a side of the second electrode material layer distal to the base substrate, and forming the second electrode by performing a photolithography process on the second electrode material layer in a yellow room after forming the etching protection layer, wherein the etching protection layer exposes the opening, the etching protection layer has a thickness greater than 5,000 angstroms, and the etching protection layer is made of at least one of silicon nitride, silicon oxide, indium tin oxide, and indium zinc oxide.

17. The method for manufacturing the display substrate of claim 16, further comprising forming an encapsulation layer on a side of the etching protection layer distal to the second electrode, wherein the encapsulation layer exposes the opening.

* * * * *